United States Patent [19]

Pellon

[11] Patent Number: 5,392,042
[45] Date of Patent: Feb. 21, 1995

[54] SIGMA-DELTA ANALOG-TO-DIGITAL CONVERTER WITH FILTRATION HAVING CONTROLLED POLE-ZERO LOCATIONS, AND APPARATUS THEREFOR

[75] Inventor: Leopold E. Pellon, Mt. Holly, N.J.

[73] Assignee: Martin Marietta Corporation, Moorestown, N.J.

[21] Appl. No.: 102,362

[22] Filed: Aug. 5, 1993

[51] Int. Cl.⁶ ............................................. H03M 3/04
[52] U.S. Cl. .................................... 341/143; 341/155; 364/825; 333/166
[58] Field of Search .................... 364/178, 180, 724.17, 364/724.10, 825; 333/19, 138, 166; 341/143, 155

[56] References Cited

U.S. PATENT DOCUMENTS

| | | | |
|---|---|---|---|
| 3,599,108 | 8/1971 | Gardner | 333/166 |
| 3,894,219 | 7/1975 | Weigel | 364/724.17 |
| 4,003,008 | 1/1977 | Miller | 333/166 |
| 4,320,362 | 3/1982 | Bellanger et al. | 333/166 |
| 4,841,471 | 6/1989 | Sloane | 364/825 |
| 4,972,356 | 11/1990 | Williams | 364/724.17 |
| 5,055,843 | 10/1991 | Ferguson, Jr. et al. | 341/143 |
| 5,055,846 | 10/1991 | Welland | 341/155 |
| 5,057,839 | 10/1991 | Koch | 341/143 |
| 5,057,840 | 10/1991 | Ledzius et al. | 341/144 |
| 5,084,702 | 1/1992 | Ribner | 341/143 |
| 5,140,325 | 8/1992 | Yu et al. | 341/143 |
| 5,148,166 | 9/1992 | Ribner | 341/143 |
| 5,266,952 | 11/1993 | Stone et al. | 341/143 |

OTHER PUBLICATIONS

"A Higher Order Topology for Interpolative Modulators for Oversampling A/D Converters", by Chao et al., published at pp. 309–318 of IEEE Transactions on Circuits and Systems, vol. 37, No. 3, Mar. 1990.

"A Comparison of Modulator Networks for High--Order Oversampled Sigma–Delta Analog-to-Digital Converters", published at pp. 145–159 of IEEE Transactions on Circuits and Systems, vol. 38, No. 2, Feb. 1991.

"A Third-Order Multistage Sigma-Delta Modulator and Reduced Sensitivity to Nonidealities", published at pp. 1764–1774 of the IEEE Journal of Solid-State Circuits, vol. 26, No. 12, Dec. 1991.

Primary Examiner—Howard L. Williams
Attorney, Agent, or Firm—W. H. Meise; C. A. Nieves; S. A. Young

[57] ABSTRACT

A sigma-delta ($\Sigma\Delta$) analog-to-digital converter (ADC) accepts band-limited analog signals, and subtracts an analog replica of an output pulse- or amplitude-density modulated (ADM) signal therefrom to produce an error signal. The error signal is processed by an analog filter or resonator with a nondelayed forward path and a tapped nonaccumulating delay line, and summed feedback and feedforward weights coupled to the taps, to thereby produce a resonated signal. An ADC processes the resonated signal, and produces the ADM signal. The ADC undesirably produces quantization noise. A digital-to-analog converter (DAC) noiselessly converts the PDM signal into the analog replica, to aid in forming the error signal. In a particular embodiment of the invention, the resonator includes a recursive analog transversal filter with delays and linear weighting elements for linearity and high operating speed. The ADC may be in a high-speed system such as a radar.

14 Claims, 10 Drawing Sheets

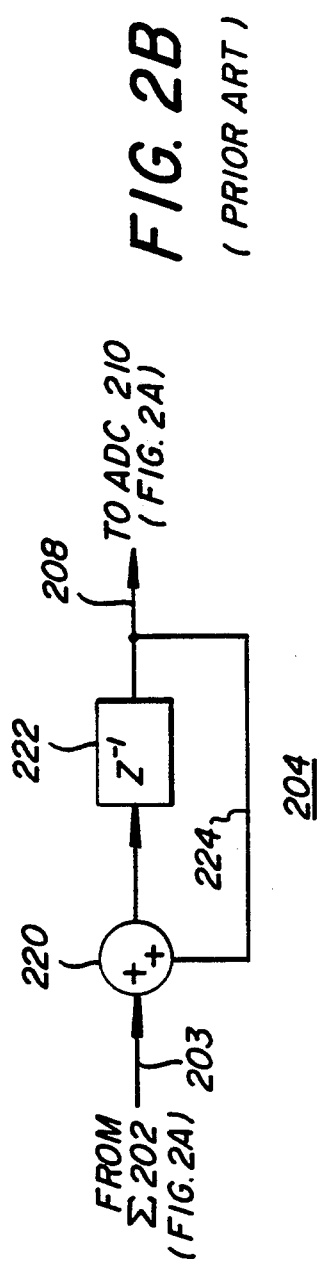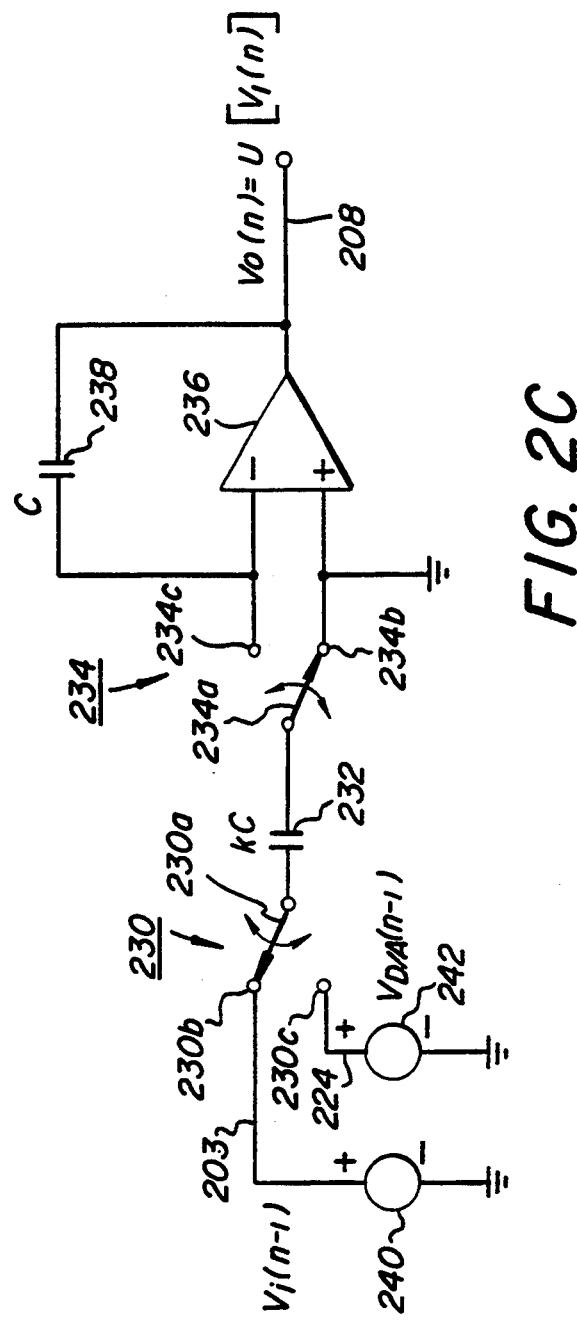
FIG. 2B (PRIOR ART)
FIG. 2C

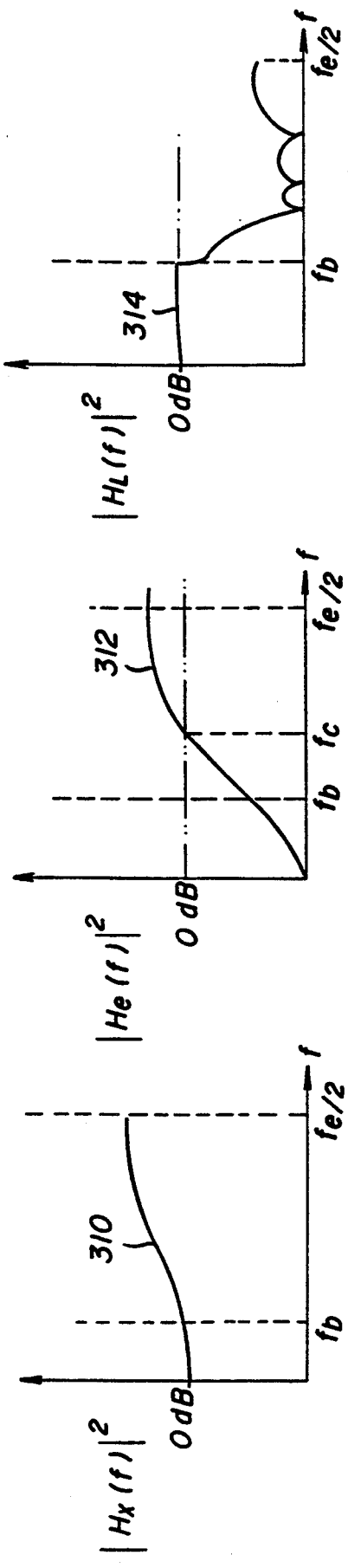

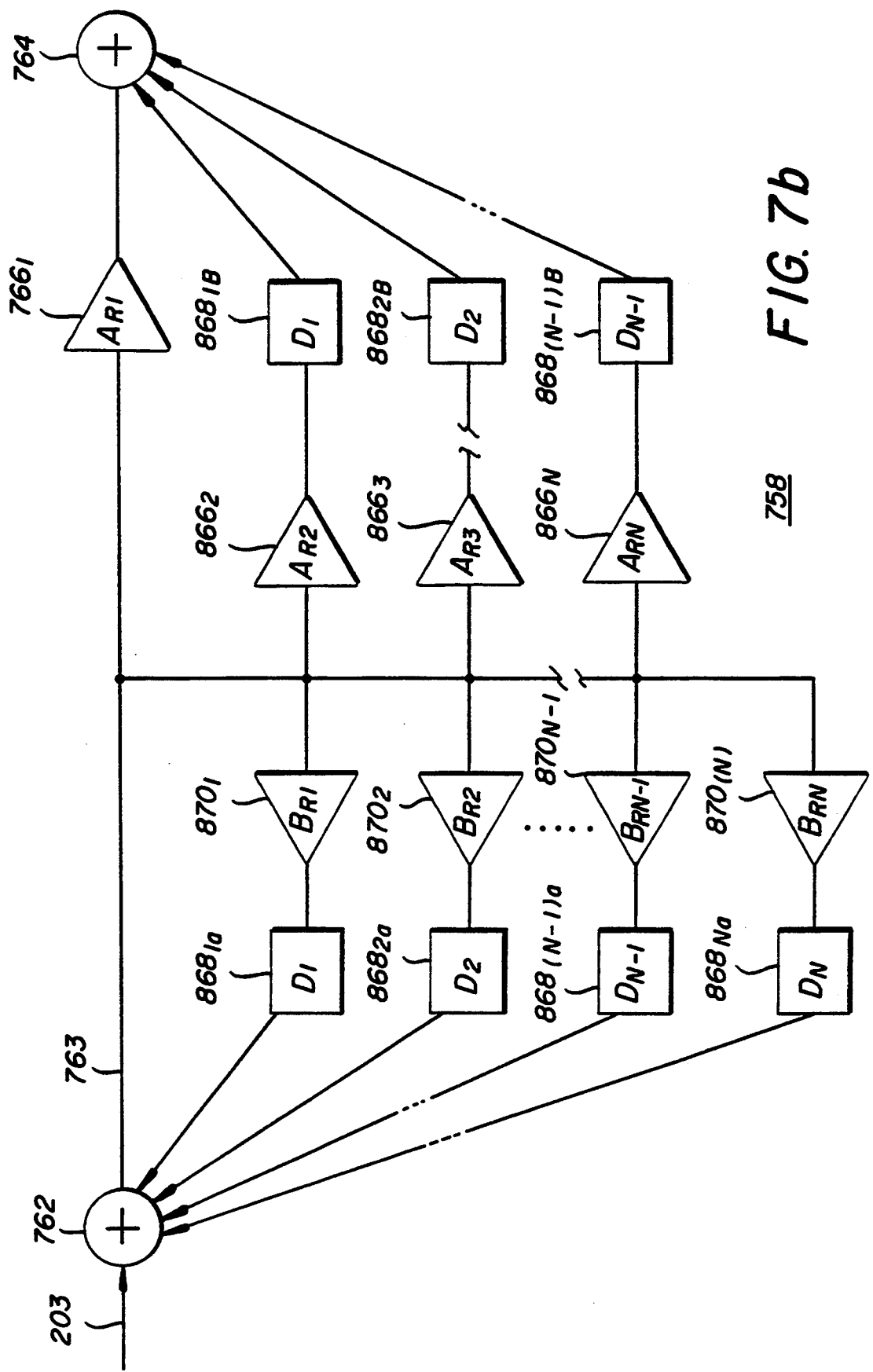

SIGMA-DELTA ANALOG-TO-DIGITAL CONVERTER WITH FILTRATION HAVING CONTROLLED POLE-ZERO LOCATIONS, AND APPARATUS THEREFOR

FIELD OF THE INVENTION

This invention relates generally to sigma-delta ($\Sigma\Delta$) modulators, and more specifically to analog-to-digital converters using $\Sigma\Delta$ modulators, in which the locations of the poles and zeroes in the forward transfer function are selected to improve suppression of quantizing noise in general and more specifically for low oversampling ratios.

BACKGROUND OF THE INVENTION

The analog-to-digital converter (ADC) is an important component in many electrical sensor, control and communications systems. Such systems often require high converter resolution and high speed for best operation.

In the past, high speed ADCs used parallel or "Flash" architectures but were limited in precision by component matching errors inherent in the fabrication process. Other known architectures such as Successive Approximation Register (SAR) and Cascade are all limited in their precision by analog component errors, either because of mismatch or because of noise and nonlinearity. The component errors determine the highest possible resolution attainable with these architectures. High speed ADCs have greater noise, increased nonlinearity, and increased mismatch with respect to lower speed ADCs as a result of the increased bandwidth of the circuits employed.

Another analog-to-digital conversion technique known as sigma-delta ($\Sigma\Delta$) conversion has been developed with a view to improving conversion accuracy with reduced sensitivity to component mismatch errors. Sigma-Delta analog-to-digital converters use quantizers within a loop, and also include noise shaping filters formed by the loop. Sigma-Delta analog-to-digital converters reduce quantizer noise, and improve the signal-to-noise (SNR) performance. The bandwidth of the noise shaping filter is a fraction of sampling rate employed in the structure. FIG. 1 is a simplified block diagram of a prior-art $\Sigma\Delta$ analog-to-digital converter. In FIG. 1, the analog input signal x(t) is applied over a conductor or signal path 100 to an input port 200 of a sigma-delta modulator 102, which receives a sampling clock by way of an input path 104. The minimum required sampling frequency is ideally at least twice the highest frequency component of the analog input signal, in accordance with the Nyquist sampling criterion. The ratio of the $\Sigma\Delta$ sampling frequency established by the clock signal on path 104 to the Nyquist minimum required sampling frequency is termed the "oversampling" ratio. Conventional quantization noise analysis indicates that the spectral density of the quantization noise can be approximated by white noise. Therefore, quantization noise is conventionally viewed as being constant from DC to one-half the sampling frequency. The spectral density is determined by the total noise power divided by half the sampling frequency. Taking this view, it follows that as the oversampling ratio increases, the amount of noise in a given bandwidth decreases. Therefore, the maximum resolution (the number of output bits) of the converter can be increased, according to conventional analysis, by increasing the oversampling ratio as much as possible to reduce quantization noise.

Sigma-delta modulator 102 of FIG. 1 converts the analog input signal into a low resolution but very high speed digital signal, which appears on data path 106. This low resolution, high speed signal is termed a pulse density modulated signal (PDM) for single-bit digital output streams or an amplitude density modulated signal (ADM) for multiple-bit digital output streams. The analog input signal modulates the density of states of the PDM or ADM output of modulator 102 so that a digital decimation filter, such as 108 of FIG. 1, reconstructs the analog input signal in digital form on output data path 110. Filter 108 of FIG. 1 includes the cascade of a low-pass or bandpass filter 109 and a decimator 113. The action of filter 108 on the pulse density modulated signal suppresses quantizer noise outside the bandwidth of modulator 102. Furthermore, the filtered output signal is decimated to a lower sample rate, as known, by selection of every Nth sample. The PDM or ADM signals contain many states over a time period corresponding to an analog input cycle at a frequency near the upper edge of the modulator or signal passband, which means that the sample rate is much higher than the highest frequency of the analog input signal. In simple quantization without the use of quantizer noise shaping, one form of which is sigma-delta processing, the quantization error is uniformly distributed with frequency in a frequency range between zero Hz (D.C.) to one-half the sample rate of the quantizer. The quantization error or noise is improved over that of a simple quantizer within the passband when using Sigma-Delta processing. The quantization noise within the bandwidth of a Sigma-Delta modulator is reduced by modulation of the density of quantizer states. By comparison with a simple quantizer, the sigma-delta processing makes better use of the multiple PDM or ADM samples available from the modulator for each output sample produced by the decimation filter. The better use is accomplished by shaping the quantization noise spectrum so that it is reduced within the same frequency band as the input signal.

The conversion which takes place in decimation filter 108 of FIG. 1 to produce the reconstructed digital output reduces the sampling frequency from that of the sampling clock frequency employed by the ADC to a lower rate, often near the Nyquist sampling rate with respect to the input signal bandwidth. Such filters are well known in the art.

FIG. 2a illustrates details of modulator 102 of FIG. 1. Elements of FIG. 2a corresponding to those of FIG. 1 are designated by like reference numerals. In FIG. 2a, analog signal applied over conductor 100 is applied to an input port 200 of modulator 102, and is sampled by a switch arrangement represented by a mechanical switch symbol 201. The sampled analog signal is applied to the noninverting (+) input port of a summing ($\Sigma$) circuit 202, which also receives at its inverting (−) input port an analog replica of the PDM output signal of the modulator. Summing circuit 202 takes the difference between the actual sampled input signal and the analog replica, produces a difference or error signal representing the deviation of the PDM output from the actual sampled analog input signal, and applies the resulting difference signal over a path 203 to an accumulating amplifier circuit or integrating amplifier circuit designated 204, which produces a transfer function $G(Z) = z^{-1}/1 - z^{1}$. Details of one embodiment of accumulating amplifier 204 appear below in conjunction with FIGS. 2b and 2c. The signal filtered by filter 204 of FIG. 2a is applied over a path 208 to an analog-to-digital converter (ADC) block 210. A sample output 209 in FIG. 2a allows examination of the output of filter 204. ADC block 210 also receives sampling clock signals from signal path or conductor 104 at its input port 212. Analog-to-digital converter 210 generates the pulse density modulated signal on output conductor 106, and also provides the PDM signal by a path 216 to a digital-to-analog converter (DAC) 218, which generates the replica of the analog input signal on conductor 206 for application to summing circuit 202. Within ADC block 210, the effect of quantization noise may be represented by a summing circuit, illustrated in dashed lines as 211, which receives the input signal over input line 208, and sums it with a quantizing noise signal applied to a second noninverting input port 213.

FIG. 2b is a simplified block diagram representing the function of a typical prior-art accumulator or integrator 204 which may be used in the arrangement of FIG. 2a. Elements of FIG. 2b corresponding to those of FIG. 2a are designated by like reference numerals. In FIG. 2b, the error signal from summing circuit 202 of FIG. 2a is applied over path 203 to a noninverting input port of a further summing circuit 220, where it is summed with a previously accumulated signal fed to a second noninverting input port over a feedback path 224. The previously accumulated signal is updated by addition of the current error signal to produce a new, updated accumulated value. The new, updated accumulated value is applied to a delay element illustrated as a block 222, which delays the accumulated sum, and makes it available after the delay on output signal path 208 and on feedback path 224. Ordinarily, the duration of the delay represented by block 222 is selected to be equal to one sampling clock interval, designated $Z^{-1}$.

FIG. 2c illustrates a more detailed embodiment of the forward signal path of the arrangement of FIG. 2b. In FIG. 2c, a first single pole, double throw switch designated generally as 230 includes a movable common member 230a, which switches or toggles between contact terminals 230b and 230c in response to a two-phase clock signal (not illustrated), and a further SPDT switch 234 has movable member 234a toggling between terminals 234b and 234c. The illustrated position of movable members is that occurring during phase 1 ($\phi_1$) of the clock signal. Also in FIG. 2c, a capacitor 232 is connected between movable switch members 230a and 234a. An operational amplifier (op amp) 236 has its inverting (−) input terminal coupled to switch terminal 234c. Switch terminal 234b and the noninverting (+) input of op amp 236 are grounded. An integrating capacitor 238 is coupled in a Miller feedback manner between the output terminal of op amp 236 and its inverting input port. The output signal is generated on output signal path 208. In FIG. 2c, input switch 230 has its first input terminal 230b connected to a voltage source designated 240, representing the input signal, the magnitude of which is $V_i(n-1)$, and switch terminal 230c is connected to a source 242, of magnitude $V_{D/A}(n-1)$. Voltage source 242 represents the signal fed back over path 224 of FIG. 2b.

Capacitor 232 of FIG. 2c is charged so that the voltage $V_1$ stored across its terminals is equal to $-V_i(n-1)$, which is the negative of the input signal. This occurs during $\Phi_1$, when switch member 230a is connected to terminal 230b, and switch member 234a is connected to terminal 234b. During $\Phi_2$, switch member 230a is connected to terminal 230c and switch member 234a is connected to 234c. Terminal 230c is connected to the D/A feedback voltage $V_{D/A}(n-1)$ as shown in FIG. 2C.

In operation of the arrangement of FIG. 2a, the digitized intermediate output PDM or ADM signal, designated y(n), is fed back by means of conductor or data path 216, digital-to-analog converter 218 and conductor or data path 206 to the inverting input of summing circuit 202 to thereby close a feedback loop. Unless the intermediate output signal y(n) is identical to sampled analog input signal x(n), a non-zero error signal is developed by summing circuit 202. This error signal flows through the forward path of the loop to correct the output. The digital intermediate output signal y(n) is both discretely sampled in time and discretely valued in amplitude. Output signal y(n) takes the form of a time series of M-bit data words, where each word represents a digital signal sample. In the case of a pulse density modulated signal, M is unity or one. The operation of the feedback loop causes the discrete amplitude values of these samples to vary with time about the value of the slowly varying analog input signal, with the amplitude of this variation constituting "shaped" quantization noise. The shaped quantization noise differs from the quantization noise added by ADC circuit 210 in FIG. 2a in that its power spectral density is not constant over frequency. Typically, analog-to-digital converter 210 and digital-to-analog converter 218 are coarse converters, and may even be single-bit converters, as mentioned above. Thus, considerable quantization noise may be introduced by analog-to-digital converter 210. It should be noted that unlike analog-to-digital converter 210, digital-to-analog converter 218 introduces no quantization noise into the feedback signal. This fact results from the definition of quantization noise as the error produced by the rounding or truncating of a continuously valued sample to that of a discrete valued sample. Digital-to-analog converter (DAC) 218 rounds or truncates its input, which has been previously rounded or truncated by ADC 210 in an identical fashion. As a result, no quantization error is introduced into the fed-back analog signal reconstructed from the digital output signal from path 216. DAC 218 may, however, add nonquantization error terms such as thermal noise, flicker noise and harmonic distortion.

FIG. 3a illustrates a plot 310 of the signal transfer function or gain, in dB versus frequency f, of the forward transfer function of the circuit of FIG. 2a. The forward transfer function of the circuit of FIG. 2a is described by its Z-transform $H_x(Z) = Y(Z)/X(Z)$, and by the substitution $Z = e^{-j2\pi f/fe}$, which is used to obtain the frequency transfer function $H_x(f)$, where fe is the sample frequency of the sampling clock driving modulator 102 of FIG. 1. The magnitude squared of the transfer function $H_x(f)$ of FIG. 3a is defined between input conductor 200 and data output 106 of FIGS. 1 and 2a. The gain of Hx(f) represented by plot 310 for signal components up to the maximum signal frequency $f_b$ is approximately unity or 1 (0 dB). Frequency $f_b$ represents the bandwidth of the input analog signal, which in this case is also its highest frequency.

FIG. 3b illustrates a plot 312 of the forward noise transfer function or gain, in dB versus frequency f, of the circuit of FIG. 2a. The quantization noise e(n), and all other error terms added in ADC 210 of FIG. 2a, and which appear on signal paths 106 and 216, may be viewed as entering ADC 210 of FIG. 2a at an input port 213. These additional noise terms are effectively applied to a virtual summing circuit 211, which adds the noise terms to the signal. A forward noise transfer function exists between input port 213 and output port 106, and is defined as He(Z)=Y(Z)/E(Z), where E(Z) is the Z-transform of e(n). To obtain the frequency forward noise transfer function from the Z-transform forward noise transfer function He(Z), by the same substitution $Z=e^{-j2\pi f/fe}$ mentioned above. Transfer functions Hx(f) of FIG. 3a and He(f) of FIG. 3b differ from each other as a consequence of e(n) entering the circuit of FIG. 2a at a different location from x(n). The gain of $H_e(f)$ as represented by plot 312 of FIG. 3b is smaller than unity for noise components up to a frequency $f_c$, and therefore has negative gain in dB. The noise is attenuated or reduced by a larger amount from zero Hz to frequency $f_b$. The negative gain (or attenuation) of noise with respect to the signal between zero Hz and $f_b$ increases the signal-to-quantizer-noise ratio (SNR) at the output of the analog-to-digital converter of FIG. 1. Noise gain 312 of He(f) of FIG. 3b increases from its level at $f_b$ toward 0 dB at a cutoff frequency $f_c$ where $f_c > f_b$ and $f_c < f_e/2$. Noise 312 of FIG. 3b at frequencies greater than $f_c$ and less than $f_e/2$ (half he sample rate employed in ADC 210 of FIG. 2a) rises to a level greater than 0 dB. The amount by which the noise gain exceeds zero dB is dependent on the pole and zero locations of G(Z).

The frequency response of decimation lowpass filter 108 of FIG. 1 is illustrated by plot 314 of FIG. 3c. Between zero Hz and $f_b$, this filter passes all components with an average gain of zero dB. Above frequency $f_b$, the gain gradually decreases (signal attenuates) toward a floor, and the gain remains near the floor up to $f_e/2$. The attenuation at frequencies above $f_b$ suppresses the quantization noise components. The amount of attenuation required to improve the resolution of the analog-to-digital converter of FIG. 1 is determined by the relative amounts of quantizer noise lying between zero Hz and $f_b$, and between $f_b$ and $f_e/2$. Decimation filter 108 of FIG. 1 will exhibit quantizer noise spectrum levels between $f_b$ and $f_e/2$ that are lower than the levels between zero Hz and $f_b$.

FIG. 3d represents, as a line spectrum 316, a noise-free analog input signal lying between zero Hz and $f_b$. If noise is present in the input signal, a conventional noise spectrum would be associated with the line spectrum. The analog signal input may encompass a range of spectral components between zero Hz and $f_b$.

FIG. 3e shows as a plot 318 the power spectrum of noise input signal e(n) to ADC 210 of FIG. 2a. As illustrated, the noise signal has a constant density $N_e$. The noise level at any sample rate is determined by the total ADC noise divided by one half the sample rate.

The spectra of output signal y(n) on output data path 106 of FIG. 2a is represented by plots 320 and 322 of FIG. 3f. The spectral density of plot 320 of FIG. 3f represents the product of noise power spectrum 318 of FIG. 3e multiplied by noise transfer function 312 of FIG. 3b. Plot 322 of FIG. 3f represents signal spectrum 316 of FIG. 3d multiplied by signal transfer function 310 of FIG. 3a. The spectrum represented by plots 320 and 322 of FIG. 3f is modified by lowpass or bandpass filter 109 of decimation filter 108 of FIG. 1 with the transfer function represented by plot 314 of FIG. 3c, to produce spectra illustrated as 416 and 420, respectively, of FIG. 4a. The signal represented by spectra 416 and 420 of FIG. 4a appear on signal path 111 of FIG. 1. In FIG. 4a, the filtered signal spectrum is substantially unattenuated relative to that of plot 322 of FIG. 3f, while the noise components represented by plot 420 are substantially attenuated by comparison with noise components represented by plot 320 of FIG. 3f over the entire band up to $f_e/2$.

In FIG. 4b, a repeated signal line spectrum, some of which lines are designated 422, extends (in principle) to infinity. A plot 424 of a repeated noise spectrum also extends to infinity. Spectra 422 and 424 represent the output of decimation filter 108 on path 110 of the analog-to-digital conversion system of FIG. 1, obtained by downsampling the filtered signal corresponding to the spectrum of FIG. 4a to a lower rate, typically 2 $f_b$. Spectra 422 and 424 are at high precision and at reduced sample rate relative to the interpolated output of lowpass filter 109 of FIG. 1. The reduced sample rate or decimation is achieved by forming a data stream representing interpolated samples selected in increments of $r_o = f_e/f_s$, where $r_o$ is most commonly an integer valued oversampling ratio. The reduced noise components between $f_b$ and $f_e/2$ are aliased with the components between zero Hz and $f_b$ of this spectrum as a result of decimation. The total signal-to-noise ratio SNR is the ratio of the total signal power represented by plot 422 to the total noise power represented by plot 424. The SNR determined in this fashion is improved by comparison with that of signal 316 of FIG. 3d and noise 318 of FIG. 3e.

The ADM total output y(n) at the output of prior art modulator 106 of FIG. 1, including signal and noise components, is given by its Z-transform $$Y(Z) = H_x(Z)X(Z) + H_e(Z)E(Z) \qquad (1)$$

Y(z) is filtered by Digital Decimation Filter 108 of FIG. 1. The forward transfer function of Digital Decimation Filter 108, represented by $H_D(Z)$, is a digital lowpass filter function with digital filter arithmetic (rounding and truncation) noise which is desirably smaller than the attenuated noise represented by plot 424 of FIG. 4b, so as not to increase the attenuated noise relative to that obtained with an ideal decimation filter. This condition can be satisfied, in the prior art, by a finite-impulse-response (FIR) filter which has, typically, between 50 and 150 tap weights or coefficients, each of which weights is of finite precision, truncated to the desired output resolution measured in bits. The FIR filter multiplies input ADM signal samples by the coefficients to create products, which are summed to produce a filtered result. The sum of products is carried out without additional truncation. The final output is then truncated to the desired resolution in bits, plus two additional bits.. The filter output with improved resolution u(n) is given by its Z-transform $$U(Z) = \underset{\text{signal}}{H_D(Z)H_x(Z)X(Z)} + \underset{\text{noise}}{H_D(Z)H_e(Z)E(Z)} \qquad (2)$$

In the sampled time domain $u(n) = x_o(n) + \epsilon_o(n)$ where $x_o(n)$ is the output signal and $\epsilon_o(n)$ is the output noise, so that u(n) represents the signal on path 111 of FIG. 1. The magnitudes of $x_o(n)$ and x(n) are approximately equal, while the magnitude of $e_o(n)$ is much smaller than the magnitude of e(n). Therefore, the SNR of the output is increased with respect to the SNR of the input signal and input ADC noise. The reduced sample rate output w(n) of analog-to-digital converter of FIG. 1 on path 110 is given by $$w(n) = u\left(\frac{fe}{2f_b} n\right) \qquad (3)$$

and is implemented by decimator 113 of FIG. 1. For example, fe=100 Mhz, $f_b$=500 KHz leads to the selection of one sample out of every 100 samples in a regular periodic fashion.

An integrator or accumulating amplifier 204 of FIG. 2a, with transfer function G(z), is explicitly described by $$G(z) = \frac{z^{-1}}{1-z^{-1}} \qquad (4)$$

G(z) as set forth in equation (4) defines a pole at $\omega=0$ and $|z|=1$, delayed by a unit sample. The signal and noise forward transfer functions $H_x(Z)$ and $H_e(Z)$, respectively, are given by $$H_x(z) = z^{-1} \quad H_e(z) = (1-z^{-1})z^{-1} \qquad (5)$$

and therefore the magnitudes of the signal and noise transfer functions as a function of frequency are given by the substitution $z = e^{2\pi f/f_e}$, and results in $$|H_x(f)|^2 = 1 \qquad |H_e(f)|^2 = 4\sin^2\left(\frac{\pi f}{f_e}\right) \qquad (6)$$

Hence, the circuit of FIG. 2a, using the accumulator configuration of FIG. 2b, yields a signal and noise response determined by a delay applied to the signal, together with a null (a zero) applied to the noise at zero Hz (DC).

Structures based on principles similar to those of FIGS. 2a and 2b have been described in the article "A Higher Order Topology for Interpolative Modulators for Oversampling A/D Converters", by Chao et al., published at pp. 309-318 of IEEE Transactions on Circuits and Systems, Vol. 37, No. 3, March 1990, in which the single integrator of FIG. 2a is replaced by a multistage cascade of integrators, with a feedback and feedforward network tapped from each stage of the cascade. The use of a multistage cascade of integrators allows a greater selection of the locations for the poles and zeroes of the noise transfer function and the signal transfer function. This increased selection is the result of the feedforward coefficients and feedback coefficients supplying as many adjustment parameters as there are poles and zeroes. The multistage cascade of integrators eliminates the problem of being underdetermined and is said to have the degrees of freedom required to place the poles and zeroes of the noise shaping filter at any location or set of locations on the Z-plane.

FIG. 5 is a simplified block diagram of a prior-art Nth order $\Sigma\Delta$ modulator 500 with a noise shaping filter 504 providing both feedforward and feedback coefficients designated A and B, respectively, as described in the abovementioned Chao et al. article. In FIG. 5, elements corresponding to those of FIGS. 1 and 2a are designated by like reference numerals. The sampled, bandlimited analog input signal X(Z) is applied over path 100 to summing circuit 202, which conceptually coacts with a further summing circuit 532 to form a multiple-input summing circuit designated 530. Summing circuit 530 takes the difference between the analog replica of the output signal appearing on signal path 206 and the analog input signal on signal path 100, and adds to the difference signal a signal produced by a further summing circuit 546, to produce an analog error or correction signal which is applied over a signal path $531_0$ to loop noise shaping filter 504. Within loop filter 504, the signal on path $531_0$ is applied to an integrator $538_1$ and to the input port of a weighting multiplier or amplifier ($A_0$) 540. Weighting amplifier $540_0$ weights the signal by coefficient or weight $A_0$ and applies it to a noninverting input port of a summing circuit 544. Integrator $538_1$ integrates the signal, or, more properly, accumulates the signal, and applies the accumulated signal over a path $531_1$ to an integrator/accumulator $538_2$, and to the inputs of weighting amplifiers $540_1$ and $542_1$ for weighting by weights $A_1$ and $B_1$, respectively. The weighted signals are applied from weighting amplifiers $540_1$ and $542_1$ to noninverting input ports of summing circuit 544 and 546, respectively. Similarly, integrator/accumulator $538_2$ accumulates its input signal, and applies the accumulated signal over a signal path $531_2$ to a further integrator/accumulator (not illustrated) of a cascade of further integrator/accumulators, and also to input ports of weighting amplifiers $540_2$ and $541_2$ for multiplication by weights $A_2$ and $B_2$, respectively, and the signals so weighted are applied to further noninverting input ports of summing circuits 544 and 546, respectively. The Nth integrator/accumulator $538_N$ of FIG. 5 accumulates the signal applied thereto, and applies the resulting accumulated signal over a signal path $531_N$ to inputs of weighting amplifiers $540_N$ and $542_N$, for multiplication by weights $A_N$ and $B_N$, respectively, and the signals so weighted are applied to the Nth inputs of summing circuits 544 and 546, respectively. The sum signal produced by summing circuit 546 is applied as a feedback signal, which may be either positive or negative, to input port 536 of summing circuit 530. The sum signal produced by summing circuit 544 is the corrected error signal, which is applied to ADC 210 to produce the desired PDM or ADM signal on signal path 106. As in the arrangement of FIG. 2a, DAC 218 produces an analog replica of the PDM signal.

FIG. 6a illustrates the Noise Transfer Function pole and zero plot in the z-plane obtained for arrangement of FIG. 5 with the weights as defined in the above Chao et al. reference. In the Z-plane of FIG. 6a, the unit circle 450 intersects the positive real (Re) axis at zero Hz. An X identifies the location of each of plural poles generated by the structure of FIG. 5, and "Os" mark the locations of zeroes. The desired pole locations are specified by the feedforward coefficients solely with the initial assumption that the feedback coefficients are zero. Modification of the feedback coefficients to place zeroes at their desired locations results in a movement of the pole locations, represented by the dashed arrows, from their desired positions at the tails of the arrows, to their actual positions at the heads of the arrows, which results in an error in the actual pole locations. This effect is small when oversampling ratios are greater than 30, but is significant at lower oversampling ratios. This leads to significant error in the placement of the noise shaping poles for the latter case. This leads to one or more of the following: reduced noise attenuation, excessive amplification of high offset frequency circulated noise and instability. This will limit the useful effective sample rate of the Sigma-Delta A/D system. FIG. 6b shows the equivalent effect in the Signal Transfer Function pole and zero plot on the z-plane for the arrangement of FIG. 5 with the aforementioned design process. The same pole selection error is obtained in this case. The locations of zeroes are determined by the feedforward coefficients for this transfer function and are completely determined by the desired pole locations.

The prior-art multistage modulator arrangement of FIG. 5 suppresses total baseband quantization noise by providing plural poles and zeroes at various locations, and therefore provides more selectability, over a given bandwidth than single-stage modulators.

Two major limitations arise with respect to the cascade-of-integrators structures, such as that of FIG. 5, when applied to the problem of high speed high precision A/D conversion. The first problem relates to the traditional approach of utilizing the integrator as a building block. Integrators are generally implemented as switched capacitor integrators, or accumulating amplifiers, based upon or equivalent to the circuit shown in FIG. 2c. Finite gain bandwidth product, slewing and other linear and nonlinear errors limit the useful rate at which the switched capacitor integrators can be clocked. Typically, this will limit the modulator sample rate to $f_e = 5$ MHZ or less for an operational amplifier gain-bandwidth product of 100 MHz. This limitation is the result of the drive currents needed to charge the sampling and accumulating capacitors of the circuit in FIG. 2c. The accumulator-integrators of the arrangement of FIG. 5, when implemented as switched capacitor circuits, have speeds which are adequate for audio and control circuit applications, but which may be insufficient for applications such as radar signal processing, High Definition TV, and high speed communications systems.

The second problem or limitation relates to the method by which the coefficients of the cascade-of-integrating circuits are obtained. Structures such as that of FIG. 5 have limitations imposed by the setting of coefficients. In such circuits, the signal transfer function $H_x(z)$ and noise transfer function $H_e(z)$ are defined by $$H_x(z) = \frac{\sum_{i=1}^{N} A_i(z-1)^{N-i}}{z\left[(z-1)^N - \sum_{i=1}^{N} B_i(z-1)^{N-i}\right] + \sum_{i=1}^{N} A_i(z-1)^{N-i}} \quad (7)$$

$$H_e(z) = \frac{(z-1)^N - \sum_{i=1}^{N} A_i(z-1)^{N-i}}{z\left[(z-1)^N - \sum_{i=1}^{N} B_i(z-1)^{N-i}\right] + \sum_{i=1}^{N} A_i(z-1)^{N-i}} \quad (8)$$

The selection of the weights $A_i$ and $B_i$ for weighting amplifiers 440 and 442 of FIG. 4 via a desired noise shaping filter $H_D(z)$ of the same order is complicated by the presence of various polynomial terms in the above equations. A solution may be obtained by first setting $B_i = 0$ and solving for $A_i(s)$ with a simplified polynomial, by equating like terms between the denominator polynomials of the prototype filter $H_D(Z)$ and the expanded form of $H_e(z)$. After this is done, weights $B_i$ are obtained by equating like terms of the numerator polynomials of $H_D(z)$ and $H_e(z)$. The numerator is composed of an N order pole at DC added to an adjustment polynomial using $B_i$. The magnitude of the $B_i$ coefficients are proportional to magnitude of the offset frequencies of that pole. For large oversampling ratios in the range $r_o > 50$, the frequencies are related by $2f_b < < f_e$, and as a result $B_i < < A_i$. The described design process results in only approximate settings for the pole locations of the signal and noise shaping transfer functions, which may result in an operable system, but one which is less than optimum.

It is desirable to have the effective sample rate as near as may be to the actual sampling rate. When the cascade-of-integrators structure is designed for small oversampling ratios, in the range $r_o < 50$, the values of the required weights $B_i$ are larger than for $r_o > 50$ since the zeroes are placed over a wider spectral region relative to the modulator sample rate. This results in a large error in the placement of the poles of both transfer functions, and affects both the optimality of the filter design and its stability. Both the SNR improvement and the increase in circulated high pass noise power is degraded. The latter may results in constraints due to the dynamic range of the ADC and DAC used in the modulator loop. Most importantly, however, the increased circulated high-pass noise power affects stability, since the deviation of the poles from their designed locations is not controlled. This deviation tends to result in actual pole locations lying outside the unit circle in the Z-plane, and thereby, tends to result in instability.

The deviation in the placement of the noise shaping filter poles affects the minimum oversampling ratio that can be used and thereby limits the maximum effective decimator output sample rate ($f_s = 2f_b$) for a given implementation of limited speed. Hence, a modulator that is limited by a 100 MHz operational amplifier gain-bandwidth product may be clocked at a rate $f_e = 5$ MHz and its high precision A/D output is limited to a small effective sample rate $f_s < 100$ KHz.

Improved $\Sigma\Delta$ analog-to-digital converters are desired.

SUMMARY OF THE INVENTION

A sigma-delta ($\Sigma\Delta$) analog-to-digital converter (ADC) accepts band-limited analog signals, and subtracts an analog replica of an output pulse density modulated (PDM) density or amplitude modulated (ADM) signal therefrom to produce an error signal. The error signal is processed by an analog filter, termed a resonator, which, in an open-circuit configuration, places Z-plane poles on the unit circle at locations displaced from zero frequency, and places zeroes within the unit circle, to thereby produce a resonated signal. An analog-to-digital converter (ADC) processes the resonated signal, and produces the PDM or ADM signal. The ADC undesirably produces quantization noise and possibly other conversion noise terms. A digital-to-analog converter (DAC) converts the PDM or ADM signal into the analog replica, to aid in forming the error signal. A feedback loop containing the resonator exhibits a signal transfer function and an ADC noise transfer function with improved characteristics. The resonator includes a cascade of nonaccumulating delays, weighting amplifiers for weighting the delayed signals, and summers for summing together the weighted delayed signals in feedback and feedforward paths. An improved coefficient weighting design applied to the resonator yields precise control of the poles and zeroes, which leads to significantly increased performance for low oversampling ratios, which in turn provides the capability for improved signal bandwidth (effective output sample rate) relative to a given modulator sample rate, and may improve suppression of ADC noise terms, including quantization noise. In a particular embodiment of this invention, the resonator is implemented in a recursive analog transversal filter topology, which provides for improved modulator speed. The sampling speed and performance may be further enhanced by replacing switched capacitor filters with continuous time filters. Performance with respect to unsuppressed harmonics of the input and feedback stages is improved by offsetting of the noise shaping band in frequency. These improvements lead to increased resolution for sampling of signals with greater bandwidths over that obtained with conventional sigma-delta modulation. Additionally, direct Intermediate Frequency (IF) sampling may be incorporated and leads to reduced harmonic distortion.

DESCRIPTION OF THE DRAWINGS

FIG. 2b illustrates details of a portion of the arrangement of FIG. 2a, and FIG. 2c shows implementation of the arrangement in FIG. 2b with a switched capacitor circuit;

FIGS. 3a through 3f are magnitude versus frequency plots of various parameters associated with the arrangement of FIG. 1; FIG. 3a represents the forward signal transfer function of the arrangement of FIG. 2a, FIG. 3b represents the noise transfer function of the arrangement of FIG. 2a, FIG. 3c represents the Decimation Low Pass Filter Transfer Function of FIG. 1; FIG. 3d represents the Input Signal of FIG. 2a, FIG. 3e represents input ADC noise spectral density of the arrangement of FIG. 2a; and FIG. 3f represents the spectral density of the ADM output of FIG. 1, showing the signal and the modulator noise density;

FIG. 7b represents an alternative arrangement of a portion of FIG. 7a;

FIG. 8 is a Z-plane plot of the pole and zero locations of the resonator of FIG. 7a;

DESCRIPTION OF THE INVENTION

Figure 1:
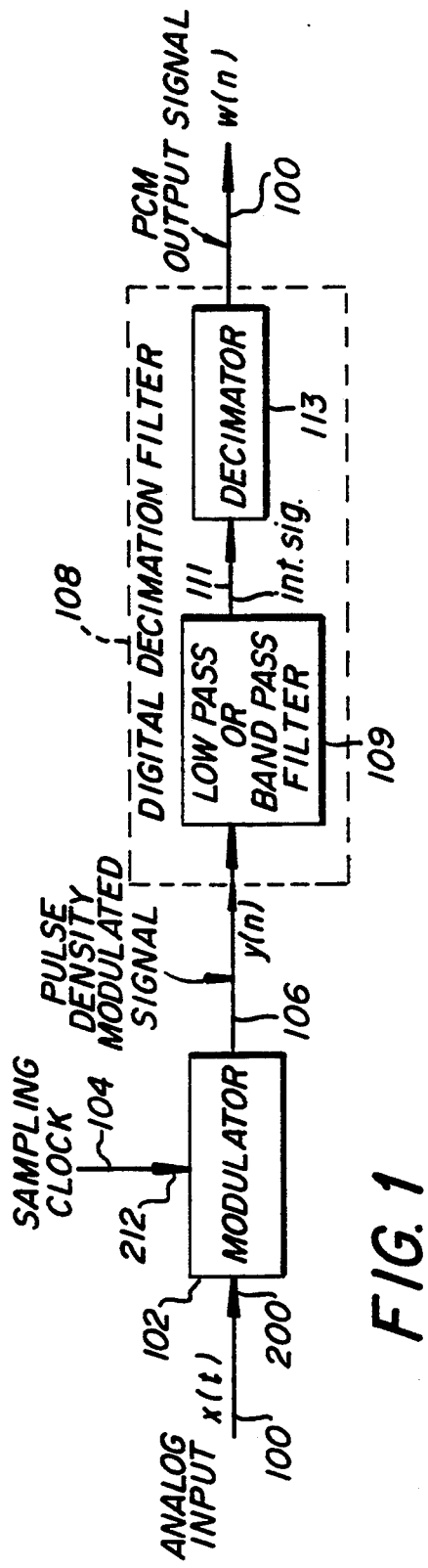
FIG. 1 is a highly simplified block diagram of a prior-art sigma-delta ($\Sigma\Delta$) analog-to-digital converter.
Figure 7A:
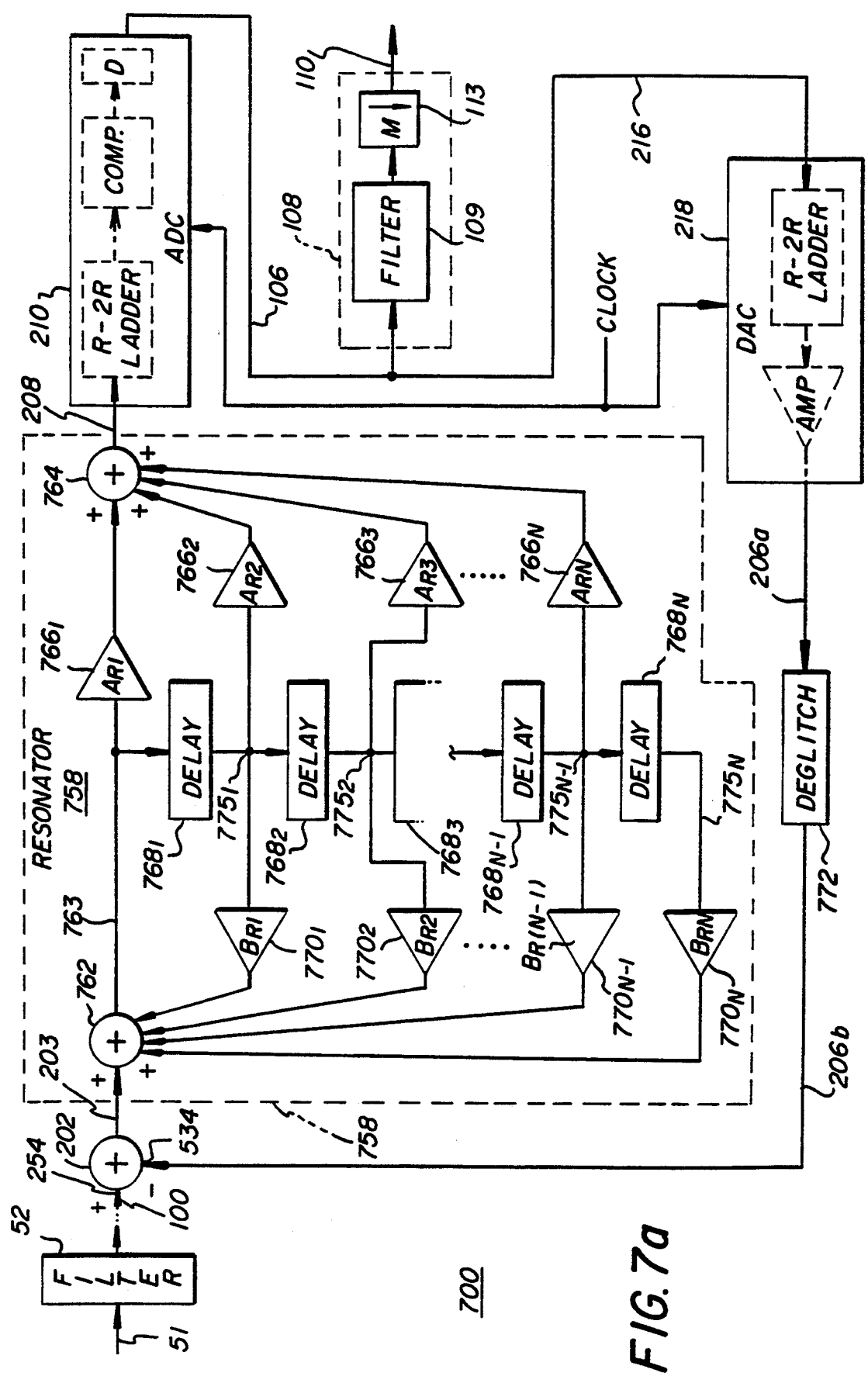
FIG. 7a is a simplified block diagram of an arrangement according to the invention.

FIG. 7a is a simplified block diagram of an analog-to-digital converter (ADC or A/D) in accordance with an aspect of the invention, in which filtration is carried out by a resonator with a recursive transversal filter including only summers, delays and linear analog amplifier or multiplier weighting elements. Preferably, the summers, delays and weighting elements are continuous time analog devices for greatest throughput bandwidth, where "continuous" means nonsampled or having infinite time resolution, and linear refers to unlimited amplitude resolution, as provided by devices such as resistors, amplifiers, and the like. For cost and size reasons, it may be desirable to make the delay elements as discontinuous time analog delay elements, such as may be implemented by switched-capacitor or other discontinuous time or sampled techniques, but still having infinite amplitude resolution. Elements of FIG. 7a corresponding to those of FIGS. 1, 2a, or 2b are designated by like reference numbers.

In FIG. 7a, band-limited analog input signals are applied by way of signal path 100 to noninverting input port 254 of summing circuit 202, or if the analog input signals are not inherently band-limited, they are applied to an input port 51 of a band-limiting filter 52, and thence by way of path 100 and port 54 to summing circuit 202. As described in conjunction with FIG. 2a, ADC 210 produces a digital PDM or ADM signal which is representative of the analog input signal, DAC 218 produces an analog replica of the PDM or ADM signal, and summing circuit 202 produces an error signal on signal path 203 representing the difference between the analog input signal and the analog replica applied to its inverting input port 534. The difference signal is applied from summing circuit 202 to a resonator 758, which performs linear analog filtration.

Figure 2A:
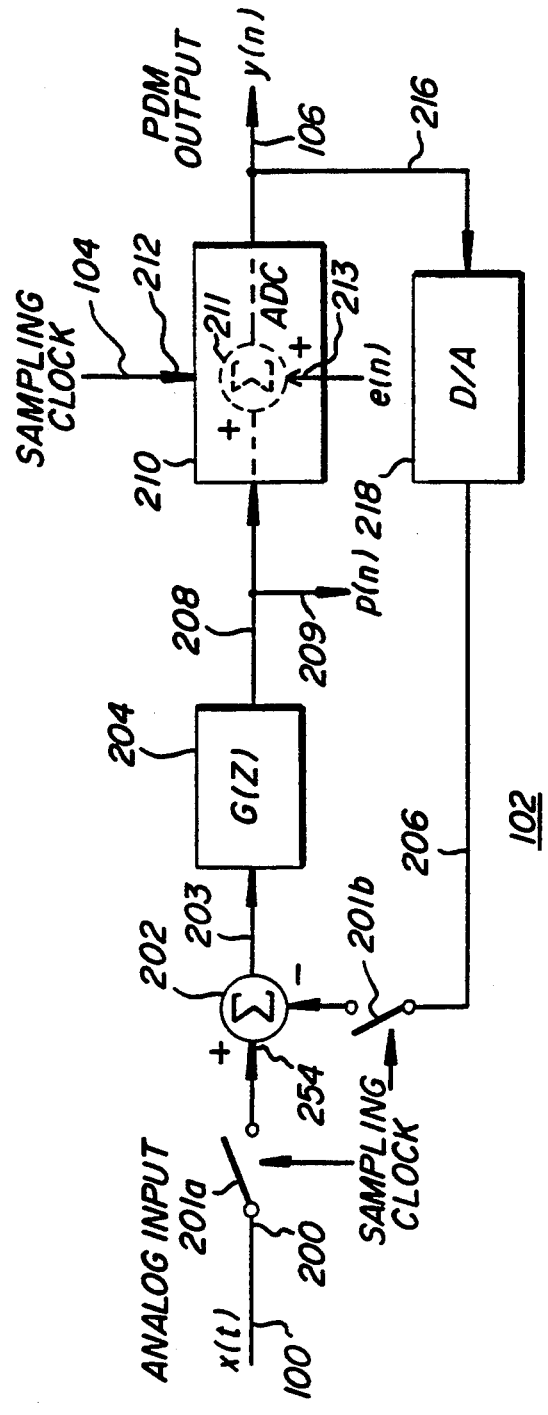
FIG. 2a is a simplified block diagram illustrating details of a portion of the arrangement of FIG. 1.
Figure 4A:
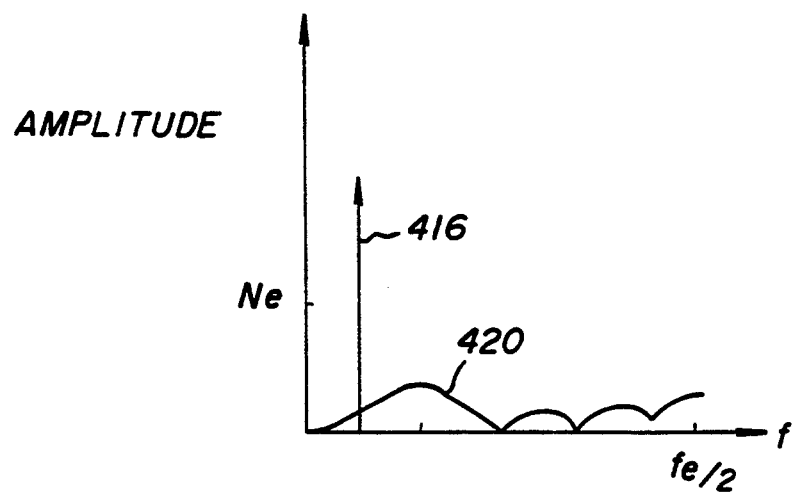
FIG. 4a illustrates the interpolated signal and noise obtained at the output of lowpass filter 109 of FIG. 1.
Figure 4B:
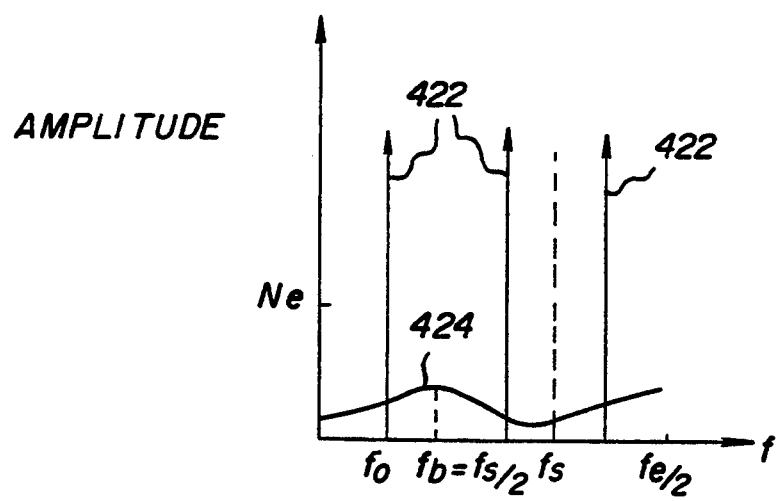
FIG. 4b represents the spectral density of the output of decimator 113 of FIG. 1.

The sampler corresponding to 201 of FIG. 2a, which represents a conversion from a continuous time analog signal to an analog discrete time signal, may be placed before, within or following adder 202 or adders 62 or 64 of resonator 758, and before or within ADC 210. As mentioned above, the preferred embodiment is continuous time up to ADC 210. Incorporation of a sampler before or within a summing circuit requires a sampler on all input ports of the summing circuit, whereas a single sampler may follow a summing circuit.

Within resonator 758 of FIG. 7a, the analog error signal from summing circuit 202 is applied over path 203 to a noninverting input port of a further summing circuit 762 of a recursive analog transversal filter 760. Summing circuit 762 adds at least one weighted feedback correction signal to the analog error signal, to produce a summed signal on a signal path 763. The summed signal on path 763 is also applied through a delay element $768_1$ to form a signal at a tap $775_1$ which is delayed by one modulator sampling clock interval $T_e = 1/f_e$. The delayed signal at tap $775_1$ is weighted with a weight $B_{R1}$ in an analog weighting amplifier 770, and the signal so weighted is applied as a feedback or recursive correction signal to a further noninverting input port of summing circuit 762. In FIG. 7a, recursive transversal filter 760 of resonator 758 includes a further analog weighting amplifier $766_1$, which weights the sum signal on path 763 with a weight $A_{R1}$ and applies the signal so weighted to a noninverting input port of a further summing circuit 764, which adds "feedforward" correction signals to the weighted signal received from weighting amplifier $766_1$, to produce a "resonated" signal on signal path 208 for application to ADC 210. A further weighting amplifier $766_2$ with weight $A_{R2}$ is connected to the output of delay $768_1$ and to a noninverting input port of summing circuit $764_1$ for weighting the one-clock-cycle delayed signal at the output of delay $768_1$. The once-delayed signal at tap $775_1$ at the output of delay $768_1$ is further delayed by a second delay element $768_2$, to produce a twice-delayed signal at a second tap $775_2$, and the twice-delayed signal is applied through a further weighting amplifier $770_2$ for weighting by a weight $B_{R2}$. The weighted signal from weighting amplifier $770_2$ is applied to a further input port of summing circuit 762. As so far described, the circuit including summing circuit 762 with output connected to path 763, delays $768_1$ and $7682_2$, and weighting amplifiers $770_1$, $770_2$, $766_1$ and $766_2$, with outputs connected to summers 762 and 764, constitutes a minimum resonator. It should be noted at this point that the description of the prior art has used the terms "integrator" and "accumulator" interchangeably. However, the described prior art uses accumulator-type integrators, in which a constant input signal results in a monotonically increasing output signal, rather than a constant signal, which results from a nonaccumulating conventional integrator, such as a transmission line, low-pass LC filter, and the like. A minimum resonator as described above is not equivalent to the accumulating integrator of the prior art, because only a cascade of delays (constant output for a constant input) is used, rather than a cascade of accumulator-type integrators (increasing output for a constant input). This may be better understood by considering that a prior-art integrator may include a delay, but when two such integrators are used, the output (corresponding to the output of summer 764 of FIG. 7a) is delayed by the sum of the delays of the integrators, whereas in the arrangement of FIG. 7a the output from summer 764 is undelayed.

Additional cascaded one-clock-cycle delays $768_3$ ... $768_N$ are coupled to the output of delay $768_2$, for producing successively delayed signals at their outputs. Weighting amplifiers $766_3$, ... $766_N$ are coupled to the outputs of delay lines $768_2$, ... $768_{N-1}$, respectively, for weighting the delayed signals by weights $A_{R3}$, ... $A_{RN}$, respectively, and for applying the delayed, weighted signals to summing circuit 764 for summing therein. Similarly, weighting amplifiers $770_3$, ... $770_{N-1}$, $770_N$ are coupled to the outputs of delays $768_3$, ... $768_{N-1}$, $768_N$, respectively, for weighting the delayed signals by weights $B_{R3}$, ... $B_{R(N-1)}$, $B_{RN}$, respectively, and for applying the delayed, weighted signals to summing circuit 762 for summing therein. It will be noted that there are N delays 768, N weighting amplifiers 766 coupled to the inputs of delays 768, and N weighting amplifiers 770 coupled to the outputs of delays 768. Resonator 758 of FIG. 7a may be considered to be configured as a recursive tapped delay line filter.

Resonator filter 758 of FIG. 7a may be implemented by transposing the delays in the center tap path, as illustrated in FIG. 7b. In FIG. 7b, elements corresponding to those of FIG. 7a are designated by like reference numbers, and elements corresponding to those of FIG. 7a but differently located are designated by the same reference numerals, but in the 800 series rather than in the 700 series. In FIG. 7b, a delay $868_{1a}$ is coupled to the output of amplifier $870_1$, and a further delay $868_{1b}$ is coupled to the output of weighting amplifier $866_2$. Each delay $868_{1a}$ and $868_{1b}$ has a delay equal to that of delay $768_1$ of FIG. 7a. Similarly, a delay $868_{2a}$ is coupled to the output of amplifier $870_2$, and a further delay $868_{2b}$ is coupled to the output of weighting amplifier $866_3$. Each delay $868_{2a}$ and $868_{2b}$ has a delay equal to that of the sum of the delays of delay elements $768_1$ and $768_2$ of FIG. 7a. Each delay $868_{(N-1)a}$ and $868_{(N-1)b}$ has a delay equal to that of the sum of the delays of delay elements $768_1$ through $768_{(N-1)}$ of FIG. 7a. The magnitudes of the transposed delays of FIG. 7a in their transposed positions equals to the cumulative delay to the corresponding weighting amplifier of FIG. 7a. Both the arrangements of FIG. 7a and FIG. 7b produce the same transfer functions, and both use the same values of weights $A_{R1} - A_{RN}$ and $B_{R1} - B_{RN}$.

The resonated analog signals produced by resonator 758 of FIG. 7a are applied over signal path 208 to analog-to-digital converter 210. Many embodiments of such an analog-to-digital converter are known to those skilled in the art. A preferred embodiment of ADC 210 uses a known flash architecture. The amplitude density modulated signal on signal path 106 is applied to a conventional decimating filter 108, which, as known, includes a low-pass or bandpass filter 109 and a decimator 113 for producing the decimated or downsampled digital output signal on data path 110. The $\Sigma\Delta$ A/D output at effective sample rate $f_s = f_e/M$ with high precision is obtained on data path 110. The amplitude density modulated signal on signal path 106 is also applied over path 216 to a conventional DAC 218, which as known creates the analog replica of the output signal on signal path $206a$. A deglitching circuit 772 may be included to reduce nonideal DAC transitions, and to suppress aliasing terms. The degliched analog replica is fed over path $206b$ to input port 534 of summing circuit 202, to aid in forming an error signal as described above.

The $\Sigma\Delta$ modulator structure according to FIG. 7a or 7b has improved signal-to-noise ratios at low oversampling ratios, $r_e = f_e/2f_b$. The low oversampling ratio is directly related to increased effective sample rates, $f_s = 2 f_b$ with respect to a fixed $\Sigma\Delta$ modulator sampling rate $f_e$. Improved signal-to-noise ratio or improved effective number of bits is also achieved at this low oversampling ratio. This performance improvement is a function of the oversampling ratio and the order of resonator 758 of FIG. 7a.

The improvement in effective number of bits is limited by errors due to nonideal behavior of feedback DAC 218, such as thermal noise, flicker noise, harmonics and spurious signals which fall within the passband of decimation filter 108. Spurious signals falling within the passband of decimator filter 108 are not suppressed by the sigma-delta loop, as ADC noise is. The lack of suppression of DAC error terms is the result of these terms receiving the same gain as that received by the input signal applied at input port 100. These DAC (non-quantization) errors present a practical limit to the effective number of bits achievable at an effective sample rate $f_s$. Even with this practical limit, however, the invention may provide significantly improved performance.

The embodiment of the invention of FIG. 7a or 7b can produce useful amounts of attenuation of ADC noise for oversampling ratios ranging between one and 50, recognizing that the attenuation approaches zero as the ratio approaches one. Such performance is better than corresponding performance of known prior art arrangements, which have difficulty in producing any attenuation at all within this range of oversampling ratios. System transfer functions of the structures according to the invention may allow fully, or at least better, determined placement of poles and zeroes, and may be capable of achieving unconditional stability with FIR or IIR impulse responses.

Figure 8:
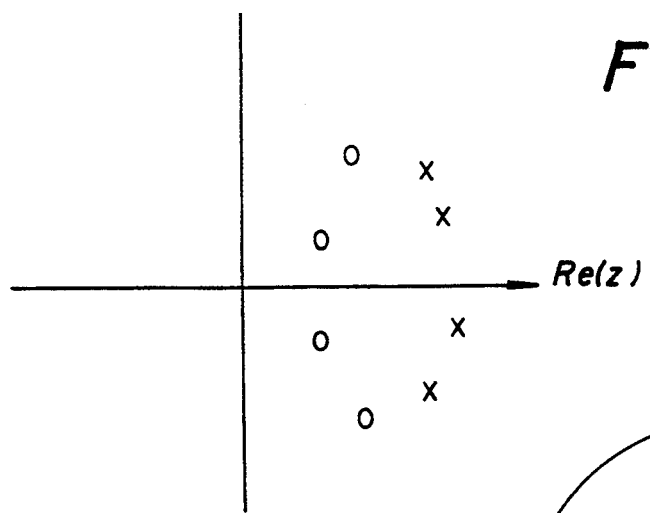

The values of weights $A_{R1} - A_{RN}$ (where the hyphen represents the word "through") and of weights $B_{R1} - B_{RN}$ in FIG. 7a are selected to place the poles directly on the unit circle in the Z-plane, as illustrated in FIG. 8, at locations remote from the zero-frequency or 0 Hz location. Those skilled in the art will realize that locations close to and within the unit circle are essentially directly on the unit circle. The values of weights $A_{R1}-A_{RN}$ and $B_{R1}-B_{RN}$ are determined by the following analysis.

An analysis of the system in FIG. 7 yields the resonator transfer function given by $$R(z) = \frac{N(z)}{D(z)} \quad (9)$$

where $$N(z) = \sum_{i=0}^{N} a_i z^{-1} \quad (10)$$

and $$D(z) = \sum_{i=0}^{N} b_i z^{-1} \quad (11)$$

From equations 15, 16 and 17, the signal transfer function $H_x(z)$ of the arrangement of FIG. 7 is $$H_x(z) = \frac{z^{-1}R(z)}{1 + R(z)z^{-1}} = \frac{z^{-1}N(z)}{D(z) + N(z)z^{-1}} \quad (12)$$

And the corresponding noise transfer function $H_e(z)$ is given by $$H_e(z) = \frac{z^{-1}}{1 + R(z)z^{-1}} = \frac{z^{-1}D(z)}{D(z) + N(z)z^{-1}} \quad (13)$$

The Signal Transfer Function and the Noise Transfer Function have a common denominator term $K(z)$ such that $$D(z) = K(z) - N(z)z^{-1} \quad (14)$$

which is termed the "coupling" equation.

For Z-transforms of $x(n)$ and $e(n)$ given by $X(z)$, $E(z)$, respectively, the output signal $Y(z)$ is given by $$Y(z) = X(z)H_x(z) + E(z)H_e(z) \quad (15)$$

The signal and noise shaping filters are then related by $$H_x(z) = 1 - H_e(z)z \quad (16)$$

which is termed the transfer function relationship. The transfer function relationship reveals the important property that small values of the Noise Transfer Function, representing attenuation, result from Signal Transfer function values of nearly 1. Therefore, the criterion of suppressing noise is complemented by improved signal transfer characteristics in which amplitude and phase ripple as a function of frequency are reduced as noise attenuation is increased.

Stability is guaranteed in the embodiment of the invention of FIG. 7, so long as the system transfer functions $H_x(z)$ and $H_e(z)$ each have poles within the unit circle and the signal paths through the amplifiers and ADC are linear (do not limit or clip). In other words, the total circulated noise power of the modulator loop must not exceed a level that can be supported by the loop ADC and DAC. As determined by simulation, this generally requires circulated noise power that is at least 4 dB below the peak output power levels of the ADC or DAC. The four-dB level affects the filter design, in that the noise circulating in the loop must be kept below the maximum dynamic range of the ADC in order to maintain loop stability, which in turn imposes a limit on the amplification of loop noise allowed outside the noise attenuation band. The circulated noise of a Sigma-Delta Modulator of a given order and oversampling ratio tends to increase in response to an increased in-band noise attenuation. Given a design of a sigma-delta modulator in which the maximum allowed circulated noise is exceeded, achieving further noise attenuation would require either (a) more bits in the ADC and DAC, or (b) an increase in the order of the resonator in order to maintain stability, or some combination of (a) and (b).

Rearrangement of the coupling equation shows that Given that $K(z)$ and $D(z)$ are causal, namely $$K(z) = k_0 + k_1 z^{-1} + k_2 z^{-2} + \ldots + k_{N-1} z^{-N} \quad (17)$$

and $$D(z) = d_0 + d_1 z^{-1} + d_2 z^{-2} + \ldots + d_{N-1} z^{-N} \quad (18)$$

The realized transfer function $N(z)$ can only be causal if all negative lag components are eliminated. The positive multiplication by z in equation (18) indicates that the zero lag components of $K(z)$ and $D(z)$ contribute to a negative lag component of $N(z)$. This negative lag component can be eliminated by the condition $$d_0 = k_0 \quad (19)$$

which will force these negative lag components to cancel. Hence, constants $d_0$ and $k_0$ must both be equal.

The noise shaping response or transfer function of arrangements according to the invention is obtained by designing $H_e(z)$ from a digital prototype filter with a stop band response attenuating the region or band between $f - f_b/2$ to $f + f_b/2$. This prototype filter $H_D(z)$ is designed by conventional digital filter design methods with band-reject or stop-band type response to achieve maximum attenuation in this band. Then $$H_e(z)z = \frac{D(z)}{K(z)} = \frac{H_d(z)}{a_0} \quad (20)$$

where we initially design a filter $H_D(z)$ using standard filter design methods specified for the required stop band characteristics, known to those skilled in the art. $H_D(z)$ will have the general IIR filter form $$H_D(z) = \frac{\sum_{i=0}^{N} a_i z^{-1}}{1 + \sum_{i=1}^{N} b_i z^{-1}} \quad (21)$$

The Noise Shaping Transfer Function will then have the form $$H_e(z)z = = \frac{1 + \sum_{i=0}^{N} \frac{a_i}{a_0} z^{-1}}{1 + \sum_{i=1}^{N} b_i z^{-1}} \quad (22)$$

This result shows that the embodiment of the invention of FIG. 7 can implement any general placement of poles and zeroes and thereby can have a characteristic obtained by all commonly used Digital Signal Processing filter design techniques. The normalization of the filter response by $a_0$ is the effect that produces the gain of the circulated noise outside the noise attenuating band. Generally, the normalization coefficient $a_0$ is less than unity or one, and hence gain is obtained. This gain scales the response of the prototype filter to obtain the actual noise shaping filter response, and also reduces the implemented noise attenuation of the modulator with respect to the originally specified attenuation in the prototype filter.

Equation 21 is solved for D(z) and N(z) to obtain the resonator coefficients $B_{R1}-B_{RN}$ and $A_{R1}-A_{RN}$ for the structure of FIG. 7. The resonator transfer function is then given by Therefore, the feedforward coefficients of the resonator are obtained by the feedback coefficients of the resonator are obtained by $$R(z) = \frac{\sum_{i=1}^{N}\left(b_i - \frac{a_i}{a_0}\right)z^{-(i-1)}}{1 + \sum_{i=1}^{N}\frac{a_i}{a_0}z^{-1}} \quad (23)$$

$$A_{Ri} = b_i - \frac{a_i}{a_0} \quad (24)$$

$$B_{Ri} = -\frac{a_i}{a_0} \quad (25)$$

An FIR filter design for the Noise Transfer Function and the Signal Transfer Function can be obtained by setting all values of $b_i$ to zero. This is equivalent to setting K(z)=1 which leads to the coupling equation $$D(z)=1-N(z)z^{-1} \quad (26)$$

and the FIR transfer functions $$H_x(z)=N(z)z^{-1} \quad H_e(z)=D(z)z^{-1} \quad (27)$$

Figure 5:
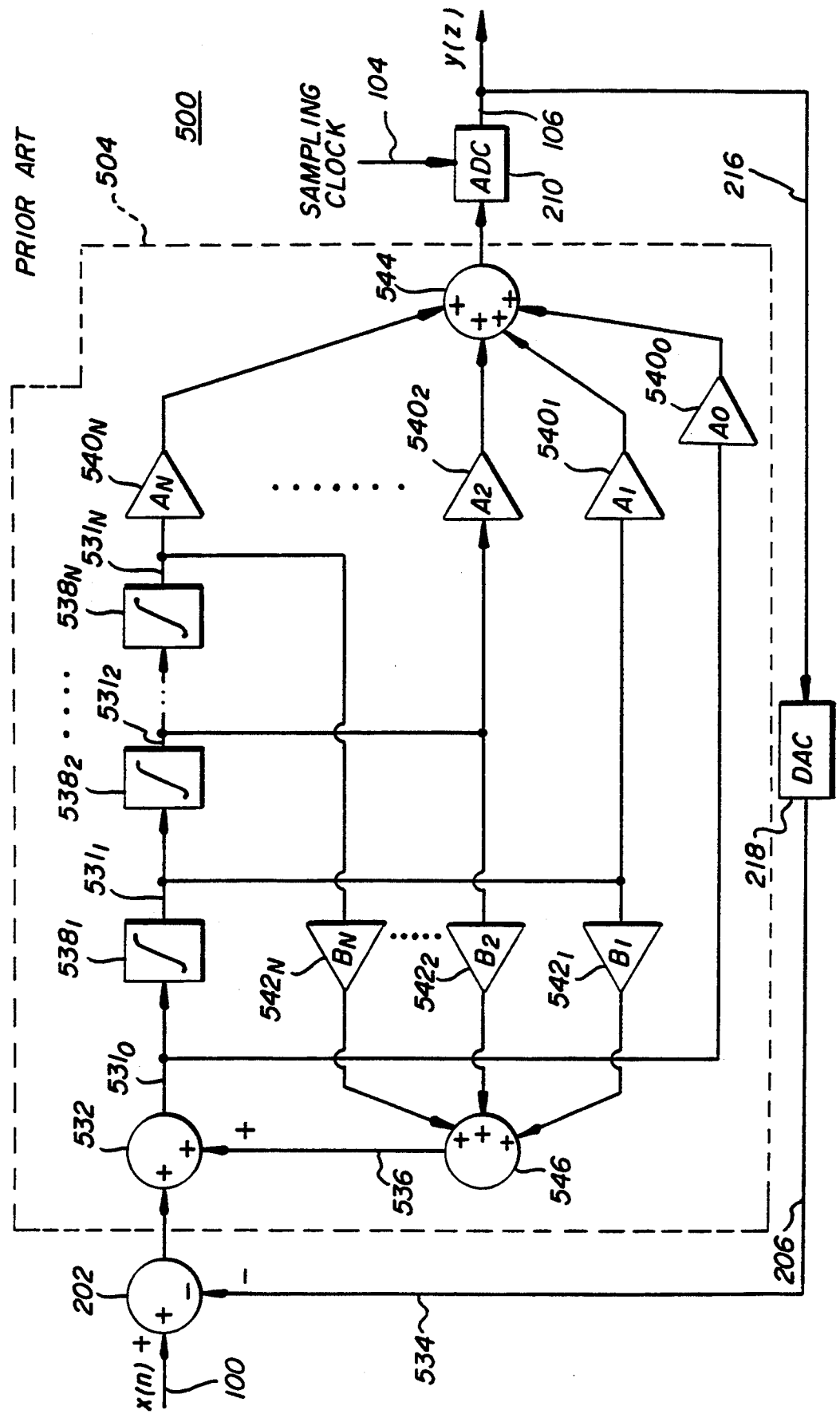
FIG. 5 is a simplified block diagram of a prior-art sigma-delta analog-to-digital converter.
Figure 6A:
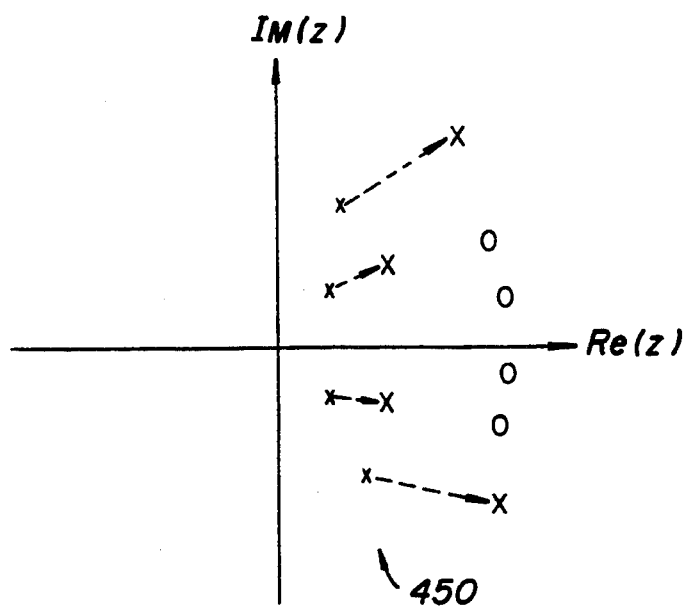
FIGS. 6a and 6b represent Z-plane poles and zeroes of the signal and noise, respectively, associated with the prior-art arrangement of FIG. 5.
Figure 6B:
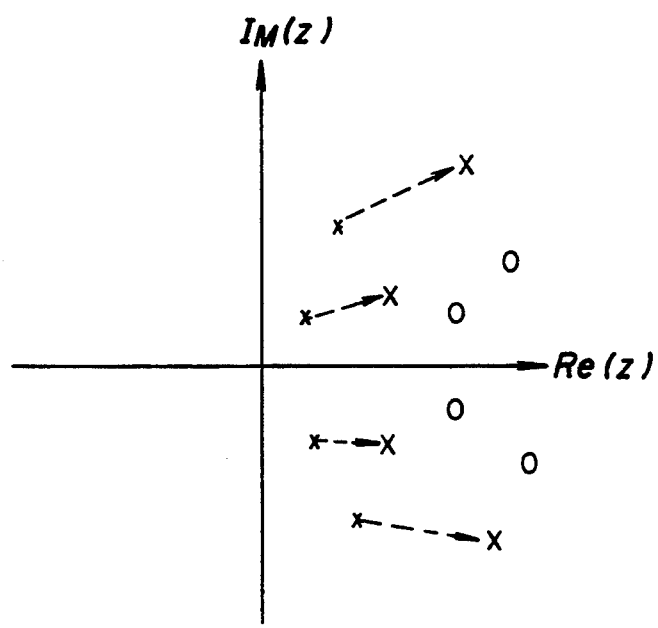
Figure 9A:
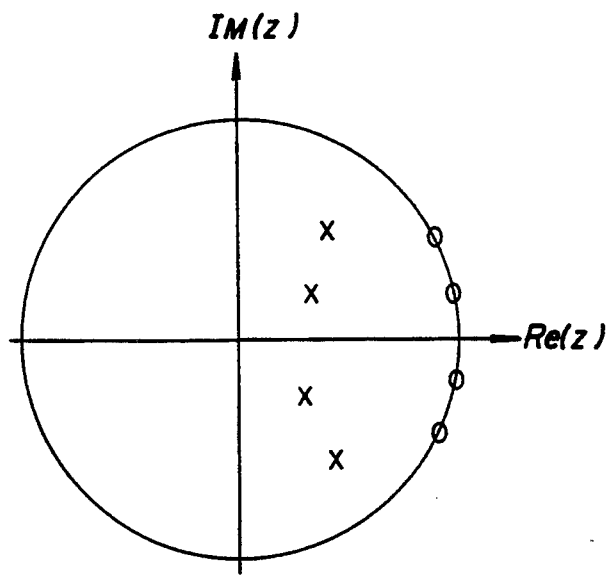
FIGS. 9a, 9b and 9c are Z-plane and frequency plots of noise and signal shaping transfer functions, and combined frequency response, respectively.
Figure 9B:
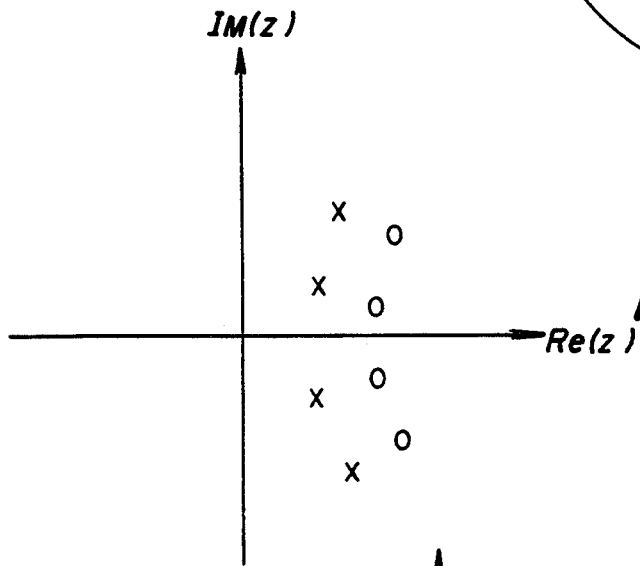
Figure 9C:
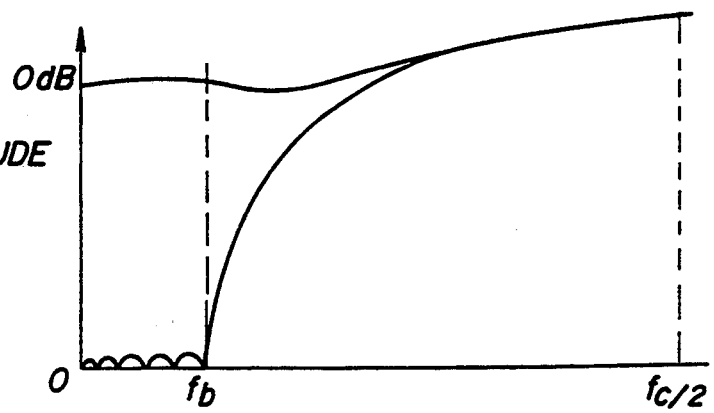

FIG. 8 shows a plot of the poles and zeroes in the z-plane of the forward transfer function, R(z), of the resonator loop filtering element, filter 758 of FIG. 7a. This element or filter is used in the arrangement of FIG. 7a to create the Noise Transfer Function and the Signal Transfer Function shown in FIG. 9a and FIG. 9b. The structure of FIG. 7a resonates the signal by means of poles placed on the unit circle, as in FIG. 8. In FIG. 8, a plurality of poles, illustrated as being four in number, are located on unit circle 450 at locations removed from zero frequency, the intersection of the real (Re) axis with unit circle 450. The pole locations on the unit circle in FIG. 8 directly correspond to zero locations in the Noise Transfer Function. The zeroes of the resonator directly correspond to the zeroes of the Signal Transfer Function. The poles zeroes determine the pole locations of the Noise Transfer Function and the Signal Transfer Function. The pole locations of the resonator are wholly determined by the feedback coefficients and the zeroes are wholly determined by the feedforward coefficients. The described calculations or process for specifying the transfer functions of the arrangement of FIG. 7a are simpler than the prior-art calculations required with an arrangement such as that of FIG. 5, because of the larger number of coefficients which can be manipulated. This simplicity allows the aforementioned resonator coefficient selection process to obtain precise locations of desired pole and zero distributions. These precise locations lead to significant enhancement of ADC noise attenuation at large oversampling ratios, which results in increased effective sample rate and conversion accuracy, for a given technology, such as switched capacitor speed limitation.

The switched capacitor circuits commonly used in Sigma-Delta modulators limits the clock rate that can be supported. This is the result of the drive current required to charge the capacitor within each clock cycle. Even without slew rate limitations, amplifier bandwidths 5 to 6 times greater than the sampling rate of the modulator are required. This will limit the maximum achievable modulator speed obtainable for a given operation amplifier technology. This obtainable speed is further reduced by slew rate limitation.

The invention of FIG. 7a in which delays 768 are implemented by continuous time delay lines, such as cables, significantly increases the obtainable modulator speed for a given amplifier technology, by eliminating the need to fully charge capacitors within the sampling interval of the modulator. According to an aspect of the invention, all active analog components used to implement the resonator loop filter are in linear operation, i.e., inverting or noninverting gain. These gains are typically less than 20 dB, small enough so that operational amplifiers operate relatively close to the unity gain or zero-dB crossover of their gain-bandwidth products, for maximized operational bandwidth.

Other continuous time delay implementations commonly known to those skilled in the art may also be used. These include, but are not limited to, passive lumped element circuits, active filtering circuits, bulk acoustic wave (BAW) devices and surface acoustic wave devices (SAW). Given high clock rates, on the order of 100 Mhz or greater, the conductor method is preferred since conductor lengths less than 7 ft. can be used.

For modulators employing relatively high sample rates, contribution of the logic circuits within the ADC and DAC to the loop path delay becomes more significant, and may be greater than the allowable loop delay. To operate the loop at speeds at which the ADC and DAC delays exceed the maximum allowable delay, the ADC and DAC sample clock are increased to a multiple of the inverse of the loop delay, to decrease the logic latency. Overclocking of ADC and DAC can be adjusted to a rate $f_{oe}=N_0f_e$ which is several times greater than $f_e=1/T_e$. Thus, the delay limitation is overcome by overclocking the ADC and DAC such that the delay of these elements are less than the total delay $T_e$. This produces a difference between these two delays that can be allocated to other delay contributors in the loop. The sum of delays of the weighting circuits, summing circuits and conductor paths of the feedback loop, termed analog delay, is equal to this difference.

Another effect of the overclocking of ADC and DAC elements of the modulator is the reduction of the average spectral density of the ADC noise. As discussed in relation to the prior art, ADC noise of a sigma-delta modulator can be approximated by white noise in which the density is determined by the total noise power divided by the Nyquist frequency. Hence, increasing the ADC and DAC clock rates as defined above will reduce the density, assuming total ADC noise is constant. This reduction in the input ADC noise density results in reduced total noise within the noise shaping band. This also translates to increased SNR and dynamic range at the output.

The arrangement of FIG. 7a can be operated so that the input signal x(t) is composed of spectral components in the frequency range 0 to fb. However, the harmonic distortion of the DAC and input summing circuits is not suppressed. Depending on the frequencies of the input, components of the harmonic distortion may or may not reside within the noise shaping band. For radar applications in which a bandlimited signal is heterodyned from a higher center frequency down to baseband and A/D converted to produce digitally sampled in-phase (i) and quadrature (Q) components, it is advantageous to use the Sigma Delta modulator to sample the signal centered at a nonzero carrier frequency. Prior-art techniques may be used to extract the I and Q components.

It would be desirable to directly sample a bandpass signal with reduced harmonic distortion. The carrier frequency is selected so that only very high order harmonics of the DAC and summing circuits reside within the signal band. The high order harmonics are smaller in the DAC and summing circuits than th lower order harmonics, and therefore contribute less distortion at the output of the modulator. The higher-order harmonics reside in the attenuating regions of the decimation filter, and are therefore rejected. This carrier frequency selection process results in improved (lower) Sigma-Delta output total harmonic distortion (THD), and thereby significantly enhances the performance of a radar system using the invention. In particular, harmonic error terms are highly undesirable in radar systems because they cannot be suppressed by digital processing.

The carrier frequency is selected, according to the above-mentioned harmonic rejection selection process, as a function of the input signal bandwidth and the modulator clock rate $f_{oe}$. The input signal bandwidth determines the noise attenuation bandwidth of the modulator. For a given frequency component of the analog signal at the input, $f_i$, harmonic components exist at frequencies 0, $2f_i$, $3f_i$, ..., $N_h f_i$. Here $N_h$ is the highest order harmonic considered, and lower-order harmonics are denoted by $l_h$. Applying Shannon's sampling theorem to these frequencies yields aliased frequency locations for these harmonics. These aliased frequencies, $f_{ai}$, can be obtained by the operation $f_{ai}=L[f_i]=+/-l_h\cdot f_i-kf_{oe}$, where L is an operator, for any integer k for which $f_{ai}$ is between 0 and $f_{oe}/2$.

The noise attenuation band is selected to be centered at $f_o$, so that only high order harmonic terms reside within the passband. Frequency $f_o$ is selected as a function of the noise shaping bandwidth, $f_b$, and the clock rate of the modulator, $f_{oe}$. When the selection is made to eliminate harmonics of order $l_h$, we require the conditions $$L\ [l_h(f_o-f_b/2)]>(f_o+f_b/2)$$

or $$L\ [l_h(f_o-f_b/2)]<(f_o-f_b/2)$$

where the harmonic rejection band is between $f_o-f_b/2$ and $f_o+f_b/2$. The first condition above is applied when the second-order harmonic does not alias. The second condition above is used when the second-order harmonic does alias. It is observed that to reject the maximum number of harmonic components, the inequalities are set to equalities and solved for $l_h=2$. This solution results in a maximum harmonic rejection frequency span. This leads to a first optimal selection $f_o=3f_b/2$ when the noise attenuation band is placed below $f_{oe}/4$ and a second optimal selection $f_o=\frac{1}{2}(f_{oe}-3f_b)$ when the band is placed above $f_{oe}/4$.

Harmonics are rejected by the arrangement of FIG. 7a, with carrier frequency selected as defined above, up to a maximum harmonic component $N_h$, which is determined by term or by $$N_h = \left[ \frac{2f_1}{\frac{f_{oe}}{2} - f_1} + .5 \right] \quad (28)$$

where the square brackets denote truncation. In this formula, $f_1$ is the lower band edge, $f_1=f_o-f_b/2$.

Figure 10:
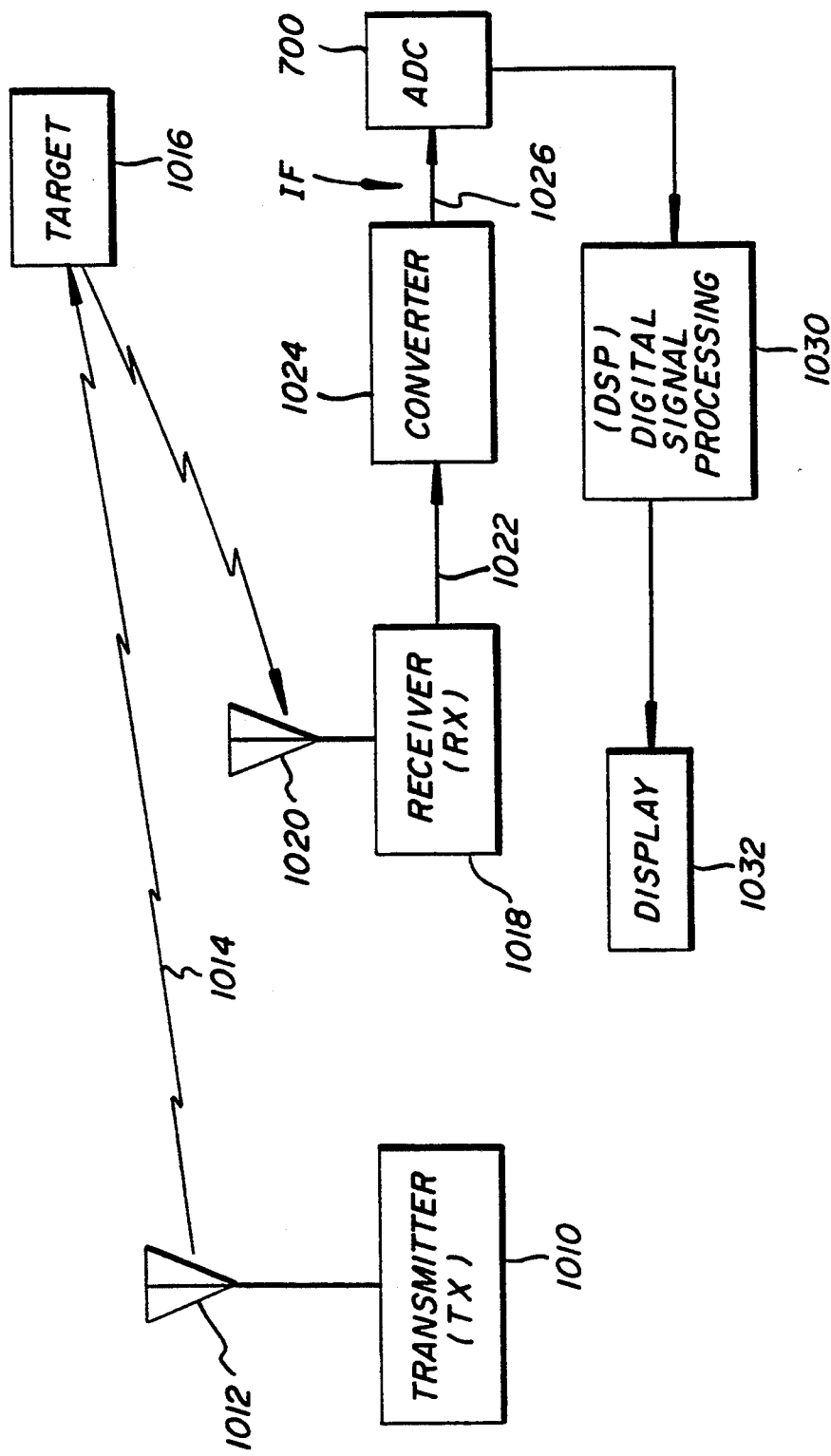
FIG. 10 illustrates a radar system according to an aspect of the invention.

A radar system according to an aspect of the invention is illustrated in FIG. 10. In FIG. 10, a transmitting arrangement includes a transmitter (TX) 1010 and an antenna 1012 for transmitting electromagnetic energy, represented as 1014, and including a carrier at a frequency, toward a target designated 1016. A receiving (RX) apparatus 1018 is coupled with an antenna (1020) for receiving echo signals from the target to produce received signals on a path 1022. The received signals are at the same carrier frequency, or near the carrier frequency if the target is in motion. A frequency converter 1024 is coupled to the receiver for converting the received signals to an intermediate frequency (IF) on a path 1026. The frequency-converted signals on path 1026 are band-limited analog signals centered at the intermediate frequency and have a defined bandwidth. An analog-to-digital converter 700 corresponding to ADC 700 of FIG. 7a is coupled to frequency converter 1024 for converting the band-limited analog signals into time- and amplitude-quantized digital signals. As described above in conjunction with FIG. 7a, the analog-to digital converter includes: (i) an analog first summer (202) including a noninverting input port (254) adapted for receiving the band-limited analog signals, and for receiving an analog replica of intermediate digital signals, for subtracting the analog replica from the analog signals to form difference signals; (ii) an N-bit analog-to-digital converter (210), where N can be unity, and subject to quantizing noise, coupled for receiving resonated signals derived from the difference signals, for generating samples of intermediate digital signals; (iii) an N-bit digital-to-analog converter (218) coupled to the analog-to-digital converter (210), for converting the intermediate digital signals into the abovementioned analog replica of the intermediate digital signals, and for coupling the analog replica to said first summer (202); (iv) a decimating filter arrangement (108) coupled to the analog-to-digital converter (210) for digitally low-pass filtering the intermediate digital signals for suppressing said quantizing noise, and for generating digital output signals representing the band-limited analog signals; and (v) a resonator (758) coupled to the analog-to-digital converter (210) and also coupled to the first summer (202) for receiving the difference signals therefrom, and for filtering the analog difference signals. As also described above in conjunction with FIG. 7a, resonator 758 includes (a) a second summer (762) coupled to the first summer for receiving the difference signals therefrom, and for adding to the difference signals at least first and second weighted delayed feedback signals, for thereby generating undelayed first summed signals; (b) a first weighting arrangement ($766_1$) coupled to the second summing arrangement (762) for weighting the undelayed first summed signals by a first weight to generate weighted undelayed intermediate signals; (c) a third summing arrangement (764) coupled to the first weighting arrangement ($766_1$) for summing the weighted undelayed intermediate signals with at least one of the weighted delayed first summed signals to produce the resonated signals; (d) a first delay arrangement ($768_1$) coupled to the second summing arrangement (762) for delaying the undelayed first summed signals by a first delay for producing first-delayed summed signals; (e) a second weighting arrangement ($770_1$) coupled to the first delay arrangement ($768_1$) for weighting the first-delayed summed signals with a second weight for producing the first weighted delayed feedback signals; (f) a third weighting arrangement ($766_2$) coupled to the first delay arrangement ($768_1$) for weighting the first-delayed summed signals with a third weight for producing a first one of the weighted delayed first summed signals; (g) a second delay arrangement ($768_2$) coupled to the first delay arrangement ($768_1$) for delaying the first-delayed summed signals by a second delay for producing second-delayed summed signals; and a fourth weighting arrangement ($770_2$) coupled to the second delay arrangement ($768_2$) for weighting the second-delayed summed signals with a fourth weight for producing the second weighted delayed feedback signals. A digital signal processing (DSP) block 1030 is coupled to ADC 700 for performing conventional radar digital signal processing, such as Doppler filtering, range sidelobe suppression, range determination, and the like, and for generating signals representing selected targets. The signals produced by DSP 1030 are applied to a display block 1032 for display of the target information. In a particular embodiment of the invention, one or the other of the N-bit analog-to-digital converters and the N-bit digital-to-analog converters of ADC 700 of FIG. 10, or both, is sampled at a particular sampling rate related to the IF carrier frequency. One advantageous intermediate frequency is equal to one-half the difference between the particular sampling rate of the ADC or DAC and three times the bandwidth of the band-limited analog IF signal. Another advantageous relationship places the intermediate frequency equal to 3/2 of the bandwidth of the band-limited IF signal, for reasons described above.

Other embodiments of the invention will be apparent to those skilled in the art. For example, while "inverting" and "noninverting" input ports have been described, they may be reversed as required, to accommodate sign reversals occurring in the various channels. Weighting "amplifiers" may, as known, produce inverting or noninverting attenuation or loss rather than inverting or noninverting gain, if appropriate for the desired transfer function. While the analog multipliers or amplifiers are ideally linear, those skilled in the art know that all such elements include inherent nonlinearities, and that some of the nonlinearities may be corrected, for example by predistortion devices.

What is claimed is:

1. An analog-to-digital converter for converting band-limited analog signals into time- and amplitude-quantized digital signals, said converter comprising;

analog first summing means (202) including a noninverting input port (254) adapted for receiving said band-limited analog signals, and for receiving an analog replica of an intermediate digital signals, for subtracting said analog replica from said analog signals to form a difference signals;

N-bit analog-to-digital conversion means (210) coupled for receiving resonated signals derived from said difference signals, for generating samples of intermediate digital signals, said analog-to-digital conversion means being subject to quantizing noise;

N-bit digital-to-analog conversion means (218) coupled to said analog-to-digital conversion means (210), for converting said intermediate digital signals into said analog replica of said intermediate digital signals, and for coupling said analog replica to said first summing means (202);

decimating filter means (108) coupled to said analog-to-digital conversion means (210) for digitally low-pass filtering said intermediate digital signals for suppressing said quantizing noise, and for generating digital output signals representing said band-limited analog signals; and resonator means (758) coupled to said analog-to-digital conversion means (210) and also coupled to said first summing means (202) for receiving said difference signals therefrom, and for filtering said analog difference signals, whereby a feedback loop is formed which tends to suppress said quantizing noise, said resonator means (758) including;

(a) second summing means (762) coupled to said first summing means for receiving said difference signals therefrom and for adding to said difference signals at least first and second weighted delayed feedback signals, for generating undelayed first summed signals;

(b) first weighting means ($766_1$) coupled to an output (763) of said second summing means (762) for weighting said undelayed first summed signals by a first weight to generate weighted undelayed intermediate signals;

(c) third summing means (764) coupled to said first weighting means ($766_1$) for summing said weighted undelayed intermediate signals with at least first weighted delayed feedforward signals to produce said resonated signals;

(d) a nonintegrating first cascade including the cascade of ($d_1$) nonintegrating delay means ($768_1$) and ($d_2$) second weighting means ($770_1$), said first cascade being coupled between said output (763) of said second summing means (762) for delaying and weighting said undelayed first summed signals, said delaying being by a first delay period, and said weighting being with a second weight, for producing said first weighted delayed feedback signals;

(e) a nonintegrating second cascade including the cascade of ($e_1$) nonintegrating delay means ($768_1$) and ($e_2$) third weighting means ($766_2$), said second cascade being coupled between said output (763) of said second summing means (762) and an input of said third summing means (764) for delaying and weighting said undelayed first summed signals, said delaying being by a second delay period, and said weighting being with a third weight ($A_{R2}$), for producing said first weighted delayed feedforward signals;

(f) a nonintegrating third cascade including the cascade of ($f_1$) nonintegrating delay means ($768_1$, $768_2$) and ($f_2$) fourth weighting means ($770_2$), said third cascade being coupled between said output (763) of said second summing means (762) and an input of said second summing means (762) for delaying and weighting said undelayed first summed signals, said delaying being by a third delay period, and said weighting being with a fourth weight, for producing said second weighted delayed feedback signals.

2. A converter according to claim 1, wherein said delay means of said first and second cascades include a common first delay element for producing first-delayed signals, and said third delay means of said third cascade includes said first delay element cascaded with a second delay element to produce second-delayed signals.

3. A converter according to claim 1, wherein said resonator means further comprises fifth weighting means ($766_3$) coupled to said second delay means ($768_2$) and to an input of said third summing means, for weighting said second-delayed summed signals for producing second weighted delayed feedforward signals.

4. A converter according to claim 1 in which said first and second delays are equal.

5. A converter according to claim 1 wherein said delay means are continuous time analog delay means.

6. A converter according to claim 1 wherein said weighting means are continuous time analog weighting means.

7. A converter according to claim 1, wherein said summing means and said weighting means of said resonator means are continuous time analog summing and weighting means, respectively, and said delay means are discrete time analog delay means.

8. A converter according to claim 1, wherein said first and second weights are equal in magnitude.

9. A converter according to claim 8, wherein said third and fourth weights are equal in magnitude.

10. A converter according to claim 1, wherein said N-bit analog-to-digital conversion means is clocked at a sample rate, and said first and second delay means each delay for a time equal to an integer multiple of the duration of one sample at said sample rate.

11. A converter according to claim 10, wherein said integer is one.

12. A converter according to claim 1, further comprising:

transmitting means for transmitting electromagnetic energy toward a target, said energy including a carrier at a frequency;

receiving means for receiving echo signals from said target to produce received signals including information relating to said target;

frequency conversion means coupled to said receiving means for converting said received signals to an intermediate frequency, for forming said band-limited analog signals centered about said intermediate frequency, whereby said time- and amplitude-quantized digital signals represent digital radar signals including information about said target;

radar digital signal processing means coupled to said analog-to-digital converter for processing said time- and amplitude-quantized digital signals for generating signals for display; and display means coupled to said radar digital signal processing means for displaying information relating to said target.

13. A radar system according to claim 12 wherein at least one of said N-bit analog-to-digital conversion means and said N-bit digital-to-analog conversion means is sampled at a particular sampling rate; and said intermediate frequency is equal to one-half the difference between said particular sampling rate and three times said bandwidth of said band-limited analog signal.

14. A radar system according to claim 12 wherein said intermediate frequency is equal to 3/2 of said bandwidth of said band-limited signal.

* * * * *